(12) United States Patent
Cheng et al.

(10) Patent No.: US 12,557,292 B2
(45) Date of Patent: Feb. 17, 2026

(54) MEMORY DEVICE AND METHOD OF FABRICATING THE SAME

(71) Applicant: MACRONIX International Co., Ltd., Hsinchu (TW)

(72) Inventors: Chen-Yu Cheng, Hsinchu (TW); Tzung-Ting Han, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 384 days.

(21) Appl. No.: 18/331,805

(22) Filed: Jun. 8, 2023

(65) Prior Publication Data
US 2024/0414921 A1    Dec. 12, 2024

(51) Int. Cl.
| | |
|---|---|
| *H01L 23/522* | (2006.01) |
| *H01L 23/528* | (2006.01) |
| *H10B 41/10* | (2023.01) |
| *H10B 41/27* | (2023.01) |
| *H10B 41/35* | (2023.01) |

(Continued)

(52) U.S. Cl.
CPC ......... *H10B 43/35* (2023.02); *H01L 23/5226* (2013.01); *H01L 23/5283* (2013.01); *H10B 41/10* (2023.02); *H10B 41/27* (2023.02); *H10B 41/35* (2023.02); *H10B 43/10* (2023.02); *H10B 43/27* (2023.02)

(58) Field of Classification Search
CPC ........ H10B 43/35; H10B 41/10; H10B 41/27; H10B 41/35; H10B 43/10; H10B 43/50; H10B 41/41; H10B 43/40; H01L 23/5226; H01L 23/5283
See application file for complete search history.

(56) References Cited

U.S. PATENT DOCUMENTS

| | | | |
|---|---|---|---|
| 11,404,091 B2 | 8/2022 | Lin et al. | |
| 2011/0188282 A1* | 8/2011 | Chevallier | G11C 5/066 438/129 |

(Continued)

FOREIGN PATENT DOCUMENTS

| | | |
|---|---|---|
| TW | 1688080 | 3/2020 |
| TW | I768969 | 6/2022 |
| TW | 202316637 | 4/2023 |

OTHER PUBLICATIONS

"Office Action of Taiwan Counterpart Application", issued on Mar. 28, 2024, pp. 1-3.

*Primary Examiner* — Galina G Yushina
(74) *Attorney, Agent, or Firm* — J.C. PATENTS

(57) ABSTRACT

A memory device includes a substrate, a composite stacked structure, multiple first insulating structures, and multiple through vias. The substrate includes a memory plane region and a periphery region. The composite stacked structure is located on the substrate in the memory plane region and the periphery region, wherein the composite stacked structure includes a first stacked structure. The first stacked structure includes multiple first insulating layers and multiple intermediate layers alternately stacked on each other, and is located on the substrate in the periphery region. The first insulating structures are separated from each other, extend through the first stacked structure in the periphery region, and are respectively surrounded by the first insulating layers and the intermediate layers. The through vias extend through one of the first insulating structures.

13 Claims, 19 Drawing Sheets

(51) Int. Cl.
 *H10B 43/10* (2023.01)
 *H10B 43/27* (2023.01)
 *H10B 43/35* (2023.01)

(56) References Cited

U.S. PATENT DOCUMENTS

| | | | | |
|---|---|---|---|---|
| 2014/0177311 | A1* | 6/2014 | Chen | G11C 5/025 |
| | | | | 438/129 |
| 2016/0267984 | A1* | 9/2016 | Tanzawa | G11C 16/08 |
| 2020/0395050 | A1* | 12/2020 | Laurent | H10B 63/24 |
| 2020/0411542 | A1* | 12/2020 | Yang | H10B 41/27 |
| 2022/0208787 | A1* | 6/2022 | Baek | H10B 41/41 |
| 2023/0106571 | A1* | 4/2023 | Shen | G11C 8/14 |
| | | | | 257/314 |
| 2023/0402335 | A1* | 12/2023 | Huang | H01L 23/10 |

* cited by examiner

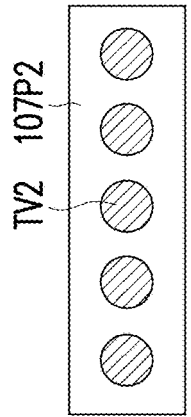
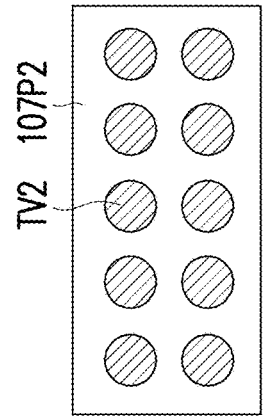
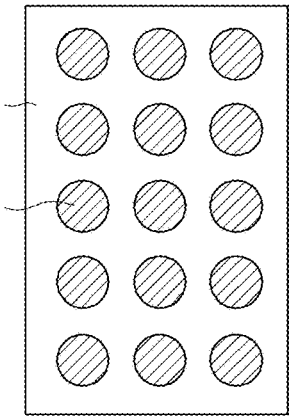
FIG. 4E  FIG. 4I  FIG. 4L
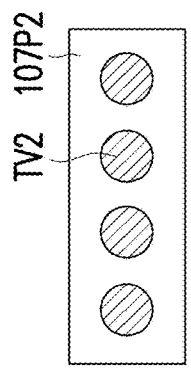
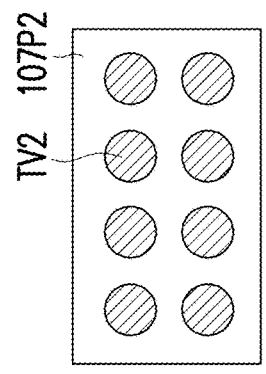
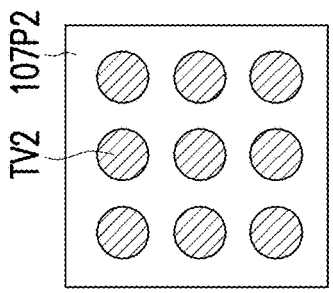
FIG. 4D  FIG. 4H  FIG. 4K
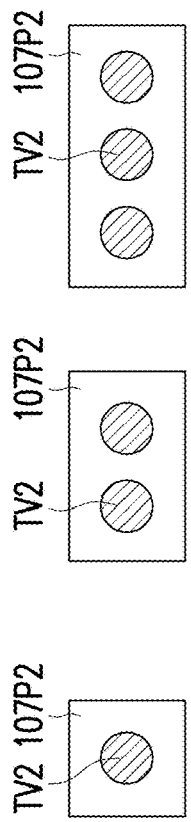
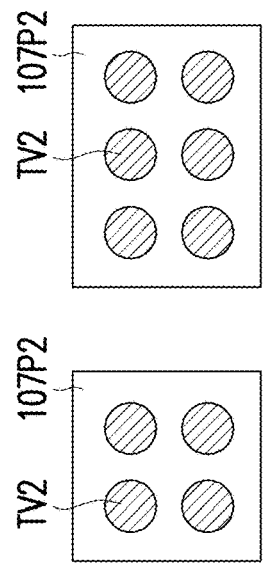
FIG. 4C  FIG. 4G  FIG. 4J
FIG. 4B  FIG. 4F
FIG. 4A

MEMORY DEVICE AND METHOD OF FABRICATING THE SAME

BACKGROUND

Technical Field

The embodiments of the present disclosure relate to a semiconductor device and a method of fabricating the same, and particularly to a memory device and a method of fabricating the same.

Description of Related Art

A non-volatile memory device (e.g., a flash memory) has the advantage that stored data does not disappear at power-off, so it becomes a widely used memory device for a personal computer or other electronic equipment.

Currently, the flash memory arrays commonly used in the industry include a NOR flash memory and a NAND flash memory. The NAND flash memory has multiple memory cells connected in series, so the NAND flash memory has better integration and area utilization than the NOR flash memory, and has been widely used in various electronic products. In addition, in order to further enhance the integration of memory devices, a three-dimensional NAND flash memory has been developed. However, there are still many challenges associated with a three-dimensional NAND flash memory.

SUMMARY

The disclosure provides a memory device capable of reducing the amount of an insulating material deposited in the periphery region.

A memory device according to an embodiment of the present disclosure includes a substrate, a composite stacked structure, multiple first insulating structures, and multiple through vias. The substrate includes a memory plane region and a periphery region. The composite stacked structure is located on the substrate in the memory plane region and the periphery region, wherein the composite stacked structure includes a first stacked structure. The first stacked structure includes multiple first insulating layers and multiple intermediate layers alternately stacked on each other, and is located on the substrate in the periphery region. The first insulating structures are separated from each other, extend through the first stacked structure in the periphery region, and are respectively surrounded by the first insulating layers and the intermediate layers. The through vias extend through one of the first insulating structures.

Based on the above, the stacked structure of a memory device of an embodiment of the present disclosure remains in a periphery region. Multiple through vias in the periphery region are insulated from each other by multiple insulating structures. The insulating structures are separated from each other. The insulating structures are formed by removing a small portion of the stacked structure in the periphery region and backfilling a small amount of an insulating material. Therefore, the deposition amount of the insulating material can be reduced, and the time for polishing the excess insulating material can be reduced.

BRIEF DESCRIPTION OF THE DRAWINGS

FIG. 3A to FIG. 3J are schematic cross-sectional views of a method of fabricating a memory device according to an embodiment of the present disclosure.

DESCRIPTION OF THE EMBODIMENTS

Figure 1:
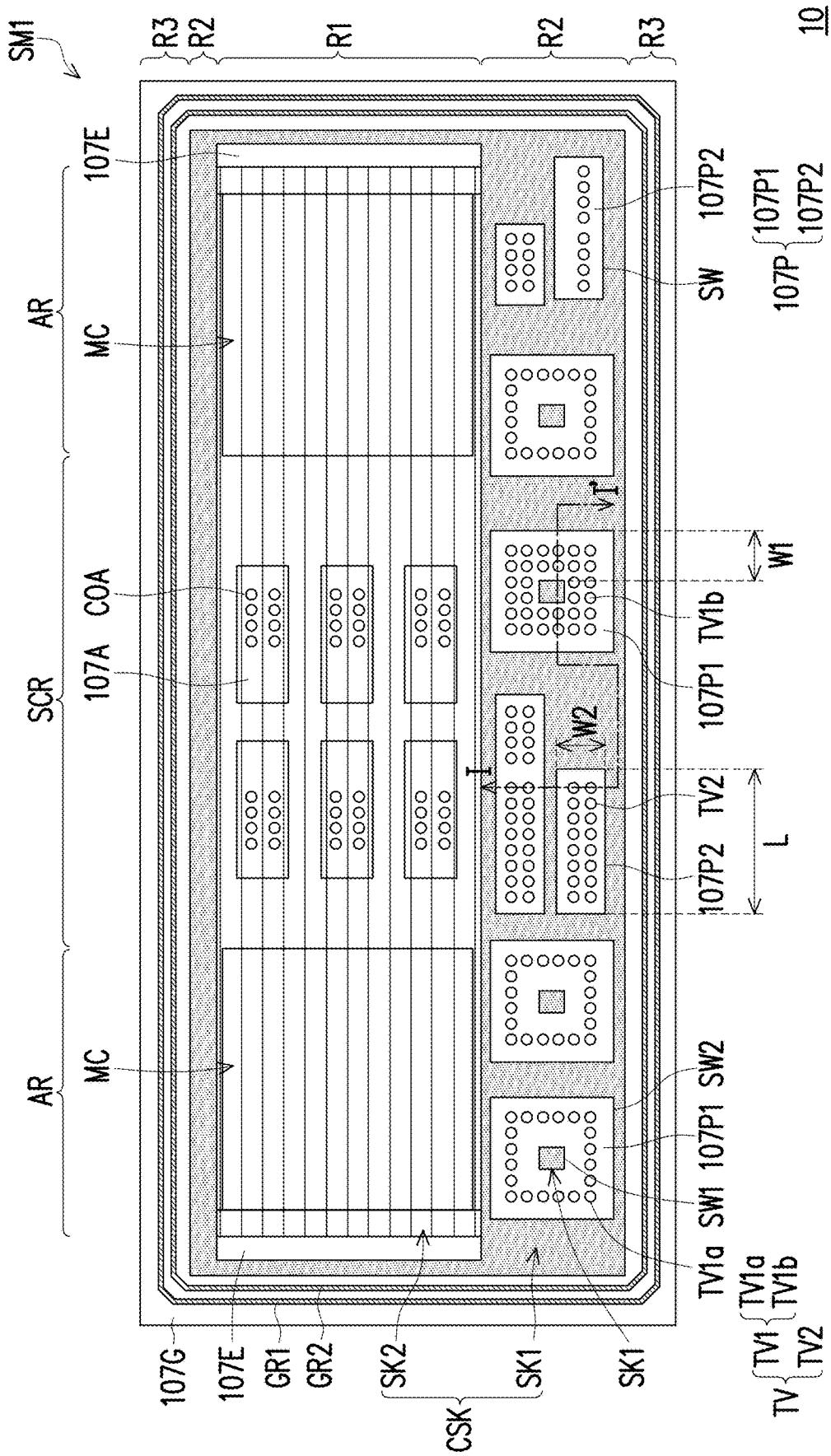
FIG. 1 is a top view of a memory device according to an embodiment of the present disclosure.
Figure 2A:
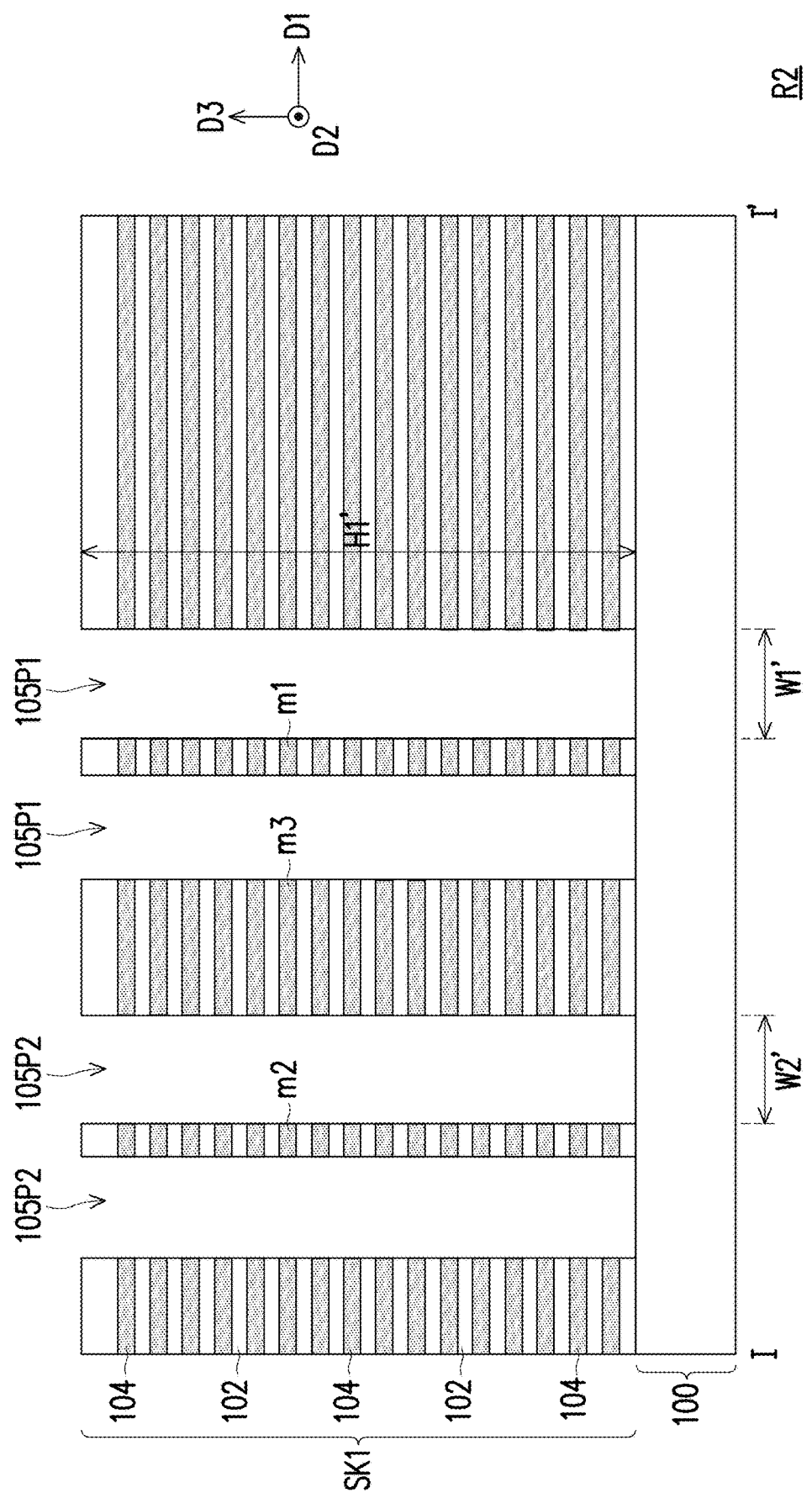
FIG. 2A to FIG. 2D are schematic cross-sectional views of a method of fabricating a memory device in a periphery region taken along the line I-I' of FIG. 1.
Figure 2B:
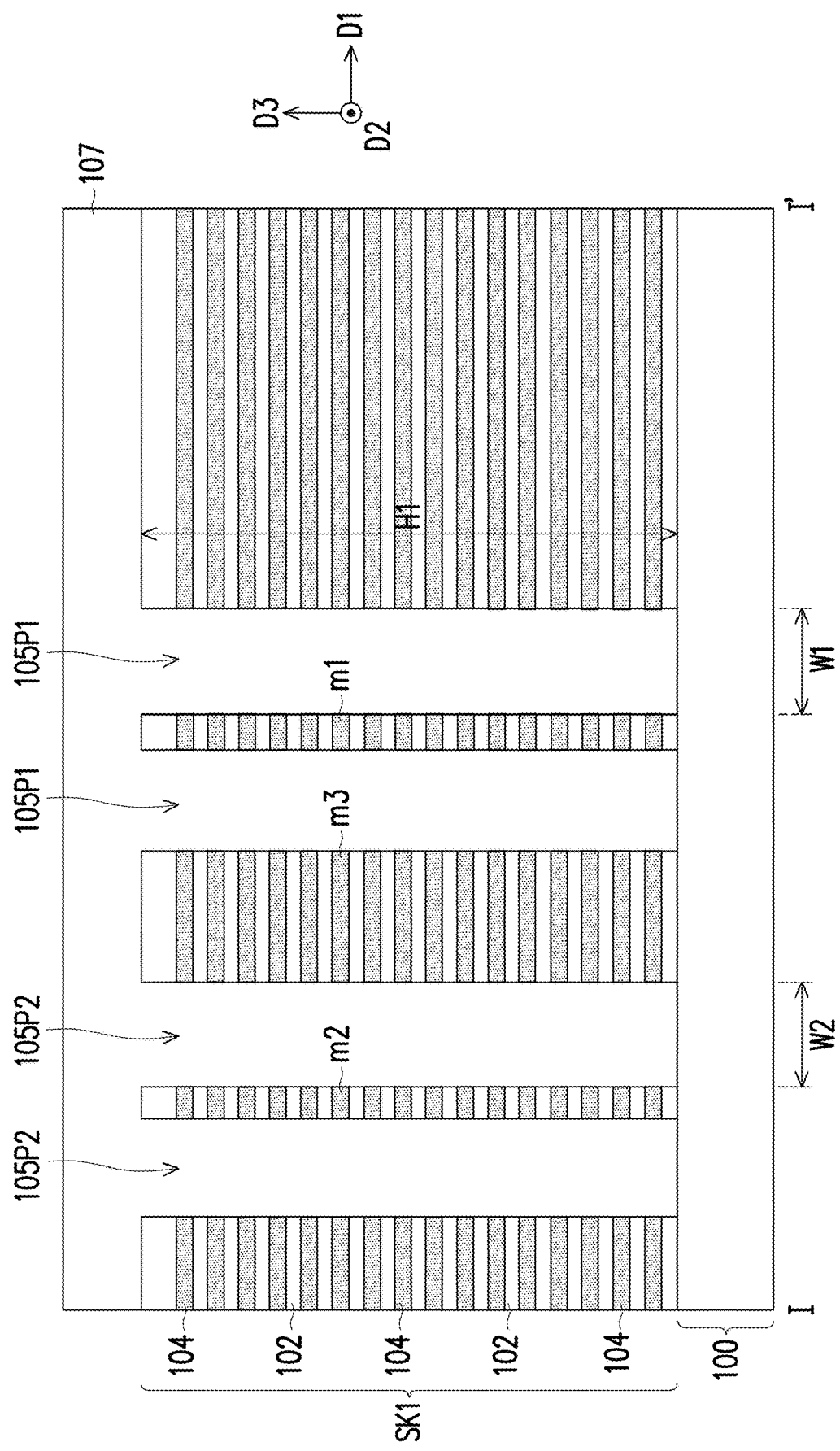
Figure 2D:
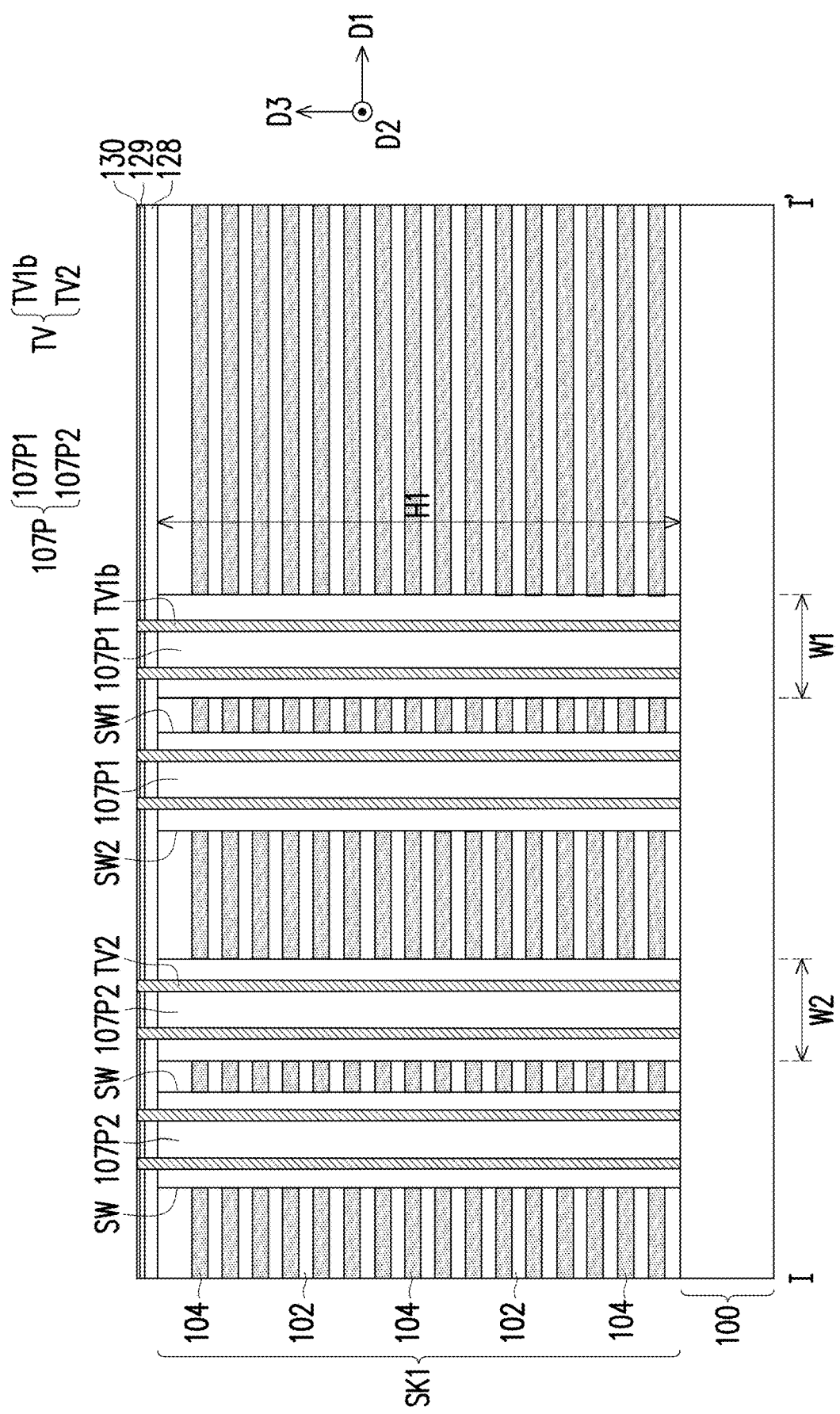

FIG. 1 is a top view of a memory device according to an embodiment of the present disclosure. FIG. 2D is a schematic cross-sectional view of a memory device in a periphery region of according to an embodiment of the disclosure. FIG. 3J is a schematic cross-sectional view of a memory device according to an embodiment of the present disclosure. FIG. 4A to FIG. 4N are top views of various through vias and insulating structures according to embodiments of the present disclosure. FIG. 4O to FIG. 4P are top views of various seal rings and insulating structures according to embodiments of the present disclosure. FIG. 5A and FIG. 5B are top views of various through vias and insulating structures according to embodiments of the present disclosure.

Referring to FIG. 1, a memory device SM1 according to an embodiment of the present disclosure includes a substrate 10, a composite stacked structure CSK, multiple insulating structures 107P, 107A, 107E, and 107G, multiple contacts COA, and multiple through vias TV. The substrate 10 includes a memory plane region R1, a periphery region R2 and a seal ring region R3. The memory plane region R1 may include a staircase region SCR and multiple array regions AR at two sides of the staircase region SCR. The periphery region R2 surrounds the memory plane area R1. The seal ring region R3 surrounds the periphery region R2.

Referring to FIG. 1, the composite stacked structure CSK is located on the substrate 10 in the memory plane region R1, the periphery region R2 and the seal ring region R3. The composite stacked structure CSK includes a first stacked structure SK1 and a second stacked structure SK2. The first stacked structure SK1 is located on the substrate 10 in the periphery region R2. The second stacked structure SK2 is located on the substrate 10 in the memory plane region R1. The second stacked structure SK2 is surrounded by the first stacked structure SK1. Referring to FIG. 3J, the first stacked structure SK1 includes multiple insulating layers 102 and multiple intermediate layers 104 alternately stacked on each other. The second stacked structure SK2 includes multiple insulating layers 102 and multiple conductive layers 126 stacked alternately. The memory device SM1 may include multiple memory cells MC located in the array regions AR of the memory plane region R1.

Referring to FIG. 1 and FIG. 3J, multiple contacts COA are disposed in the staircase region SCR of the memory plane region R1 and are electrically connected to the conductive layers 126 (as shown in FIG. 3J).

The memory device SM1 includes multiple insulating structures 107A. Each insulating structure 107A surrounds multiple contacts COA, so as to insulate the contacts COA from the surrounding second stacked structure SK2. The insulating structures 107A are separated from each other, extend through the second stacked structure SK2 in the staircase region SCR of the memory plane region R1, and are respectively surrounded by the insulating layers 102 and the conductive layers 126.

Referring to FIG. 1, the memory device SM1 further includes multiple insulating structures 107E located at ends of the array regions AR of the memory surface region R1, and configured to separate the first stacked structure SK1 from the second stacked structure SK2.

Referring to FIG. 1, the memory device SM1 further includes a seal ring GR and an insulating structure 107G. The seal ring GR is located in the seal ring region R3. The seal ring GR continuously surrounds the boundary of the first stacked structure SK1. The seal ring GR can include a single ring (as shown in FIG. 4O), or double rings including seal rings GR1 and GR2 (as shown in FIG. 4P). The insulating structure 107G is separated from the insulating structures 107E by the first stacked structure SK1. Referring to FIG. 1, the insulating structure 107G surrounds the boundary of the first stacked structure SK1 and surrounds the boundary of the seal ring GR. In other words, the seal ring GR extends through the insulating structure 107G.

Referring to FIG. 1, multiple through vias TV and multiple insulating structures 107P are disposed in the periphery region R2. The through vias TV and the insulating structures 107P extend through the first stacked structure SK1. In an embodiment of the disclosure, multiple insulating structures 107P surrounds multiple through vias TV. In other words, multiple through vias TV extend through the insulating structures 107P, as shown in FIG. 3J. The insulating structures 107P are surrounded by the first stacked structure SK1 remaining in the periphery region R2. The insulating structures 107P are not connected to each other, and are separated from each other by the first stacked structure SK1. The insulating structures 107P are also separated from the insulating structures 107A, 107E and 107G by the first stacked structure SK1.

Referring to FIG. 2D, multiple insulating structures 107P extend through the first stacked structure SK1 in the periphery region R2. The insulating structures 107P are respectively surrounded by the insulating layers 102 and the intermediate layers 104. The insulating structures 107P are separated from each other by the insulating layers 102 and the intermediate layers 104 of first stacked structure SK1.

Referring to FIG. 1, the shape of the insulating structure 107P may include a ring shape, a rectangle shape, a polygon shape, or a combination thereof. For example, the insulating structure 107P1 of the insulating structures 107P has a ring shape, and the insulating structure 107P2 of the insulating structures 107P has a rectangle shape.

Referring to FIG. 1, the insulating structure 107P1 has a ring shape. The insulating structure 107P1 surrounds a part of the first stacked structure SK1. Another part of the first stacked structure SK1 surrounds the insulating structure 107P1. The ring shape can include a square ring shape, a rectangular ring shape, a circular ring shape, an oval ring shape or a combination thereof. Referring to FIG. 2D, inner sidewalls SW1 and outer sidewalls SW2 of the insulating structures 107P1 are respectively in contact with the insulating layers 102 and the intermediate layers 104 of the first stacked structure SK1.

Referring to FIG. 1, the insulating structure 107P2 has a rectangle shape. The rectangle shape can include a square shape or a rectangle shape, as shown in FIG. 4A to FIG. 4N, FIG. 5A and FIG. 5B. Referring to FIG. 2D, outer sidewalls SW of the insulating structures 107P2 are in contact with the insulating layers 102 and the intermediate layers 104.

Figure 2C:
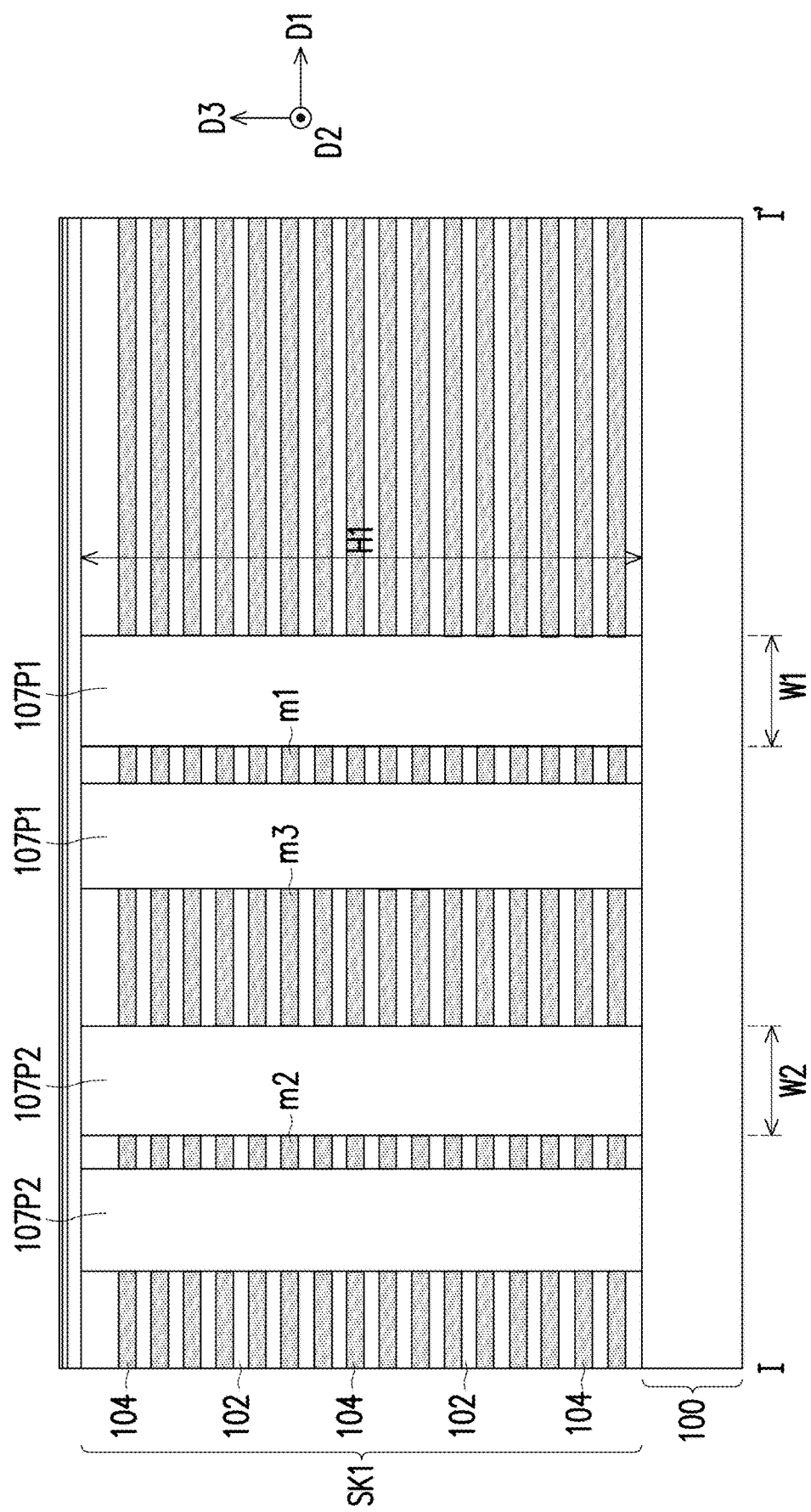

Referring to FIG. 2C, in some embodiments, the ratio of the width (e.g., ring width) W1 to the height H1 of the insulating structure 107P1 is less than 2, or the ratio of the width W2 to the height H1 of the insulating structure 107P2 is less than 2.

Referring to FIG. 1, in the ring-shaped insulating structure 107P1, multiple through vias TV1 may be arranged in an orderly manner. For example, multiple through vias TV1a are arranged in a single ring, multiple through vias TV1b are arranged in double rings, and multiple through vias TV1 are arranged in more rings. In the ring-shaped insulating structure 107P1, multiple through vias TV1 may also be arranged in a random order.

Figure 4M:
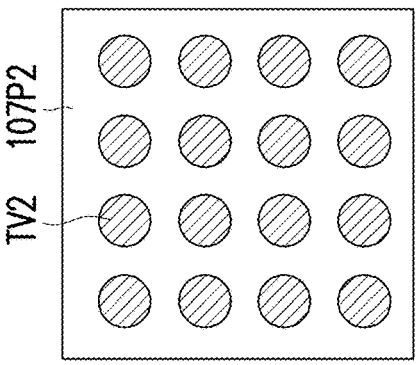
FIG. 4A to FIG. 4N are top views of various through vias and insulating structures according to embodiments of the present disclosure.
FIG. 4O to FIG. 4P are top views of various seal rings and insulating structures according to embodiments of the present disclosure.
Figure 4N:
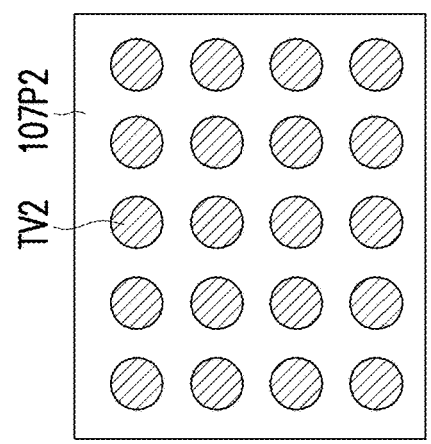
Figure 4O:
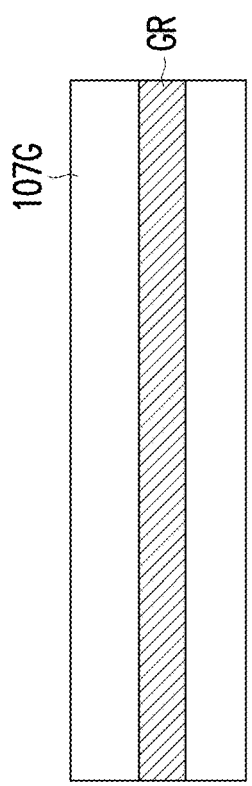
Figure 4P:
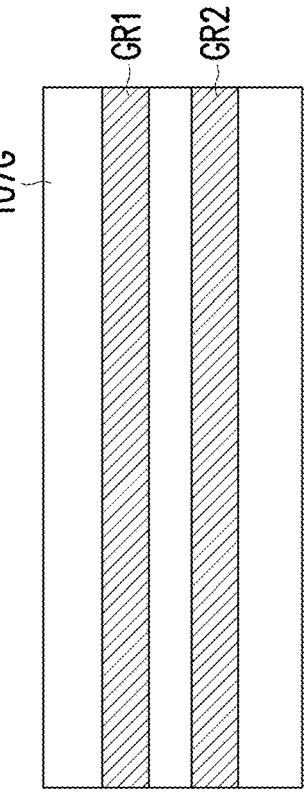
Figure 5A:
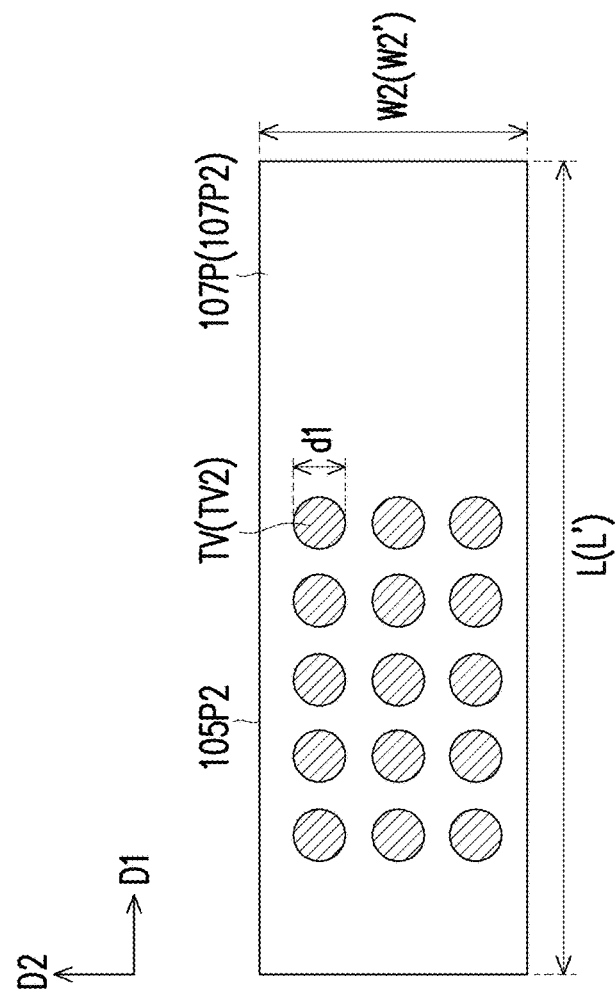
FIG. 5A and FIG. 5B are top views of various through vias and insulating structures according to embodiments of the present disclosure.
Figure 5B:
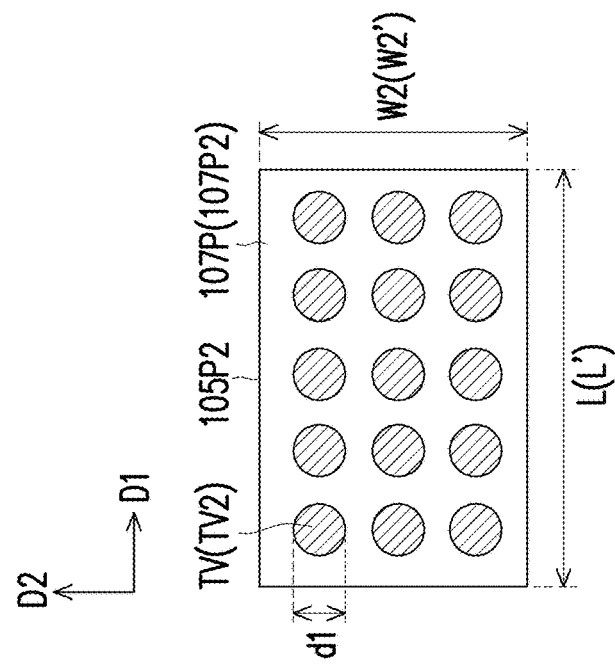

Referring to FIG. 4A to FIG. 4N, in each rectangular insulating structure 107P2, only a single through via TV2 can pass through the insulating structure (as shown in FIG. 4A) or multiple through vias TV2 can pass through the insulating structure (as shown in FIG. 4B to FIG. 4N). The multiple through vias TV2 may be arranged in an orderly manner, e.g., arranged in an array (as shown in FIG. 4B to FIG. 4N). The multiple through vias TV2 can also be arranged in a random order (not shown).

Referring to FIG. 5A, multiple through vias TV may be distributed across the entire area in the insulating structure 107P. Referring to FIG. 5B, multiple through vias TV may be distributed in a local area in the insulating structure 107P, but not in another area. The number of the through vias TV of FIG. 5A is the same as the number of the through vias TV of FIG. 5B. The length of the insulating structure 107P of FIG. 5A in a first direction D1 is different from the length of the insulating structure 107P of FIG. 5B in the first direction D1. The width of the insulating structure 107P of FIG. 5A in a second direction D2 is the same as the same as the width of the insulating structure 107P of FIG. 5B in the second direction D2. That is to say, the same number of the through vias TV can be arranged in different insulating structures 107P with different areas.

The through vias TV may be evenly distributed across the entire area of the insulating structure 107P (as shown in FIG. 5A), or evenly distributed in a local area of the insulating structure 107P (as shown in FIG. 5B). In some embodiments (not shown), multiple through vias TV may be unevenly distributed across the entire area in the insulating structure 107P, or unevenly distributed in a local area in the insulating structure 107P.

Referring to FIG. 1, each insulating structure 107P in the periphery region R2 is located around multiple through via TVs without occupying too much volume. For example, referring to FIG. 2D, in some embodiments, the ratio of the width W1 to the height H1 of the insulating structures 107P is less than 2. Referring to FIG. 5A and FIG. 5B, the ratio of the sum of the diameters d1 of the through vias TV2 along the second direction D2 to the width W2 of the insulating structure 107P2 along the second direction D2 is from 0.006 to 0.15.

Referring to FIG. 1, in an embodiment of the present disclosure, the through vias TV in the first stacked structure SK1 in the periphery region R2 are formed in multiple insulating structures 107P instead of a single bulk insulating structure. The method of forming the insulating structures 107P is shown in FIG. 2A to FIG. 2D.

FIG. 2A to FIG. 2D are schematic cross-sectional views of a method of fabricating a memory device in a periphery region taken along the line I-I' of FIG. 1.

Referring to FIG. 2A, multiple insulating layers 102 and multiple intermediate layers 104 are alternately stacked on a substrate 100 along a third direction D3 to form a first stacked structure SK1. Other layers such as conductive layers, insulating layers, device layer, etc. (not shown) may be included between the first stacked structure SK1 and the substrate 100. The insulating layer 102 and the intermediate layers 104 may be silicon oxide layers and silicon nitride layers, respectively.

Multiple openings 105P1 and 105P2 are formed in the first stacked structure SK1. Each opening 105P1 may be a ring-shaped opening, and each opening 105P2 may be a rectangular opening. The volumes of the openings 105P1 and 105P2 are controlled within a certain range to reduce the amount of an insulating material subsequently filled in the openings 105P1 and 105P2. In the embodiment of the present disclosure, the width W1' of the opening 105P1 in the second direction D2 and the width W2' of the opening 105P2 in the second direction D2 are controlled within a certain range. In some embodiments, the ratio of the width W1' of the opening 105P1 to the height H1' of the first stacked structure SK1 is less than 2, for example. The ratio of the width W2' of the opening 105P2 to the height H1' of the first stacked structure SK1 is smaller than 2, for example. If the ratio is greater than 2, the amount of an insulating material subsequently filled in the openings 105P1 and 105P2 will be increased.

On the other side, the lengths of the openings 105P1 and 105P2 in the first direction D1 may have greater flexibility and are not strictly limited. Referring to FIG. 5A and FIG. 5B, for example, the length L' of the opening 105P2 in the first direction D1 can be shorter (as shown in FIG. 5A) or longer (as shown in FIG. 5B). This is because the thickness of the filled insulating material 107 (as shown in FIG. 2B) is related to the width W2' of the opening 105P2 in the second direction D2, while is irrelevant with the length L' of the opening 105P2 in the first direction D1. That is to say, regardless of the length L' of the opening 105P2, as long as the thickness of an insulating material 107 is greater than 1/2 of the width W2', the opening 105P2 can be filled with the insulating material 107.

Referring to FIG. 2B, an insulating material 107 is formed on the first stacked structure SK1. The insulating material 107 continuously extends on the first stacked structure SK1 and is filled into the openings 105P1 and 105P2. The insulating material 107 may include silicon oxide. The first part m1 of the first stacked structure SK1 remains in the ring-shaped opening 105P1, two rectangular opening 105P2 are separated by a second part m2 of the first stacked structure SK1, a third part m3 of the first stacked structure SK1 remains between the rectangular opening 105P2 and the ring-shaped opening 105P1, so the amount of the required insulating material 107 can be reduced.

Referring to FIG. 2C, a chemical mechanical polishing process or an etching back process is performed to remove the excess insulating material 107 on the first stacked structure SK1, so as to form insulating structures 107P1 and 107P2 in the openings 105P1 and 105P2. In some embodiments, the ratio of the width (e.g., ring width) W1 to the height H1 of the insulating structure 107P1 is less than 2. The ratio of the width W2 to the height H1 of the insulating structure 107P2 is less than 2.

Referring to FIG. 2D, a dielectric layer 128, a stop layer 129, and a dielectric layer 130 are formed on the first stacked structure SK1. The dielectric layer 128, the stop layer 129, and the dielectric layer 130 may be a silicon oxide layer, a silicon nitride layer, or a silicon nitride layer, respectively. Afterwards, through vias TV1b and TV2 are formed in the insulating structures 107P1 and 107P2. The method of forming the through vias TV1b and TV2 may include forming multiple through via openings in the dielectric layer 128, the stop layer 129, the dielectric layer 130 and in the insulating structures 107P1 and 107P2, filling the through via openings with a metal material, and then performing a chemical mechanical polishing process or an etching back process. The metal material may be tungsten.

Referring to FIG. 1, in an embodiment of the present disclosure, the first stacked structure SK1 remains in the periphery region R2. The through vias TV in the periphery region R2 are insulated from each other by multiple insulating structures 107P. The insulating structures 107P are separated from each other, and are separated from the insulating structures 107A, 107E, 107G. The insulating structures 107P may be formed simultaneously during the formation of the insulating structures 107A, 107E, and 107G.

FIG. 3A to FIG. 3J are schematic cross-sectional views of a method of fabricating a memory device according to an embodiment of the present disclosure.

Figure 3A:
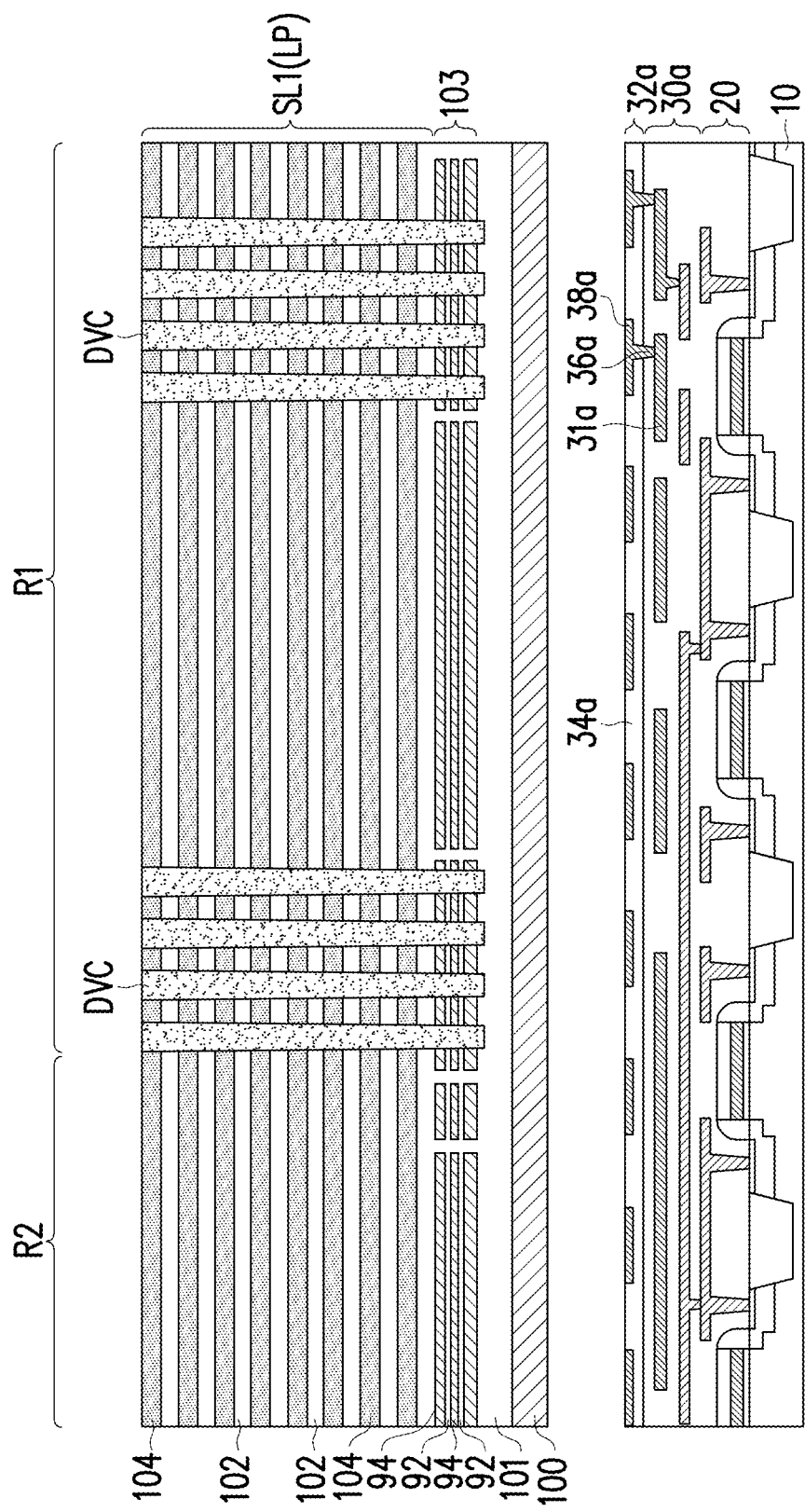

Referring to FIG. 3A, a substrate 10 is provided. The substrate 10 may be a semiconductor substrate, such as a silicon-containing substrate. A device layer 20 is formed on the substrate 10. The device layer 20 may include active elements or passive elements. The active elements may include transistors, diodes, or the like. The passive elements may include capacitors, inductors, or the like. The transistors may include an N-type metal oxide semiconductor (NMOS) transistor, a P-type metal oxide semiconductor (PMOS) transistor or a complementary metal oxide semiconductor (CMOS) device.

Referring to FIG. 3A, a first portion 30a of an interconnect structure 30 is formed on the device layer 20. The first portion 30a of the interconnect structure 30 may include multiple dielectric layers (not shown) and interconnect layers (not shown) formed in the multiple dielectric layers. The interconnect layers include multiple plugs (not shown), multiple conductive lines (not shown) or the like. A dielectric layer separates adjacent conductive lines from each other. The conductive lines may be connected by plugs, and the conductive lines may be connected to the device layer 20 by plugs. The first portion 30a of the interconnect structure 30 may be formed by a single damascene process, a dual damascene process, or any known method.

Referring to FIG. 3A, a first portion 32a of a bonding structure 32 (shown in FIG. 3J) is formed on the first portion 30a of the interconnect structure 30. The first portion 32a of the bonding structure 32 includes a bonding layer 34a, a bonding plug 36a and a bonding pad 38a. The bonding layer 34a may include silicon oxide, silicon nitride or a combination thereof. The bonding plug 36a and the bonding pad 38a may include copper, for example. The bonding pad 38a is connected to the topmost conductive line 31a of the first portion 30a of the interconnect structure 30 by the bonding plug 36a. The bonding pad 38a and the bonding plug 36a may be formed by a single damascene or a dual damascene process. The bonding pad 38a, the bonding plug 36a, and the bonding layer 34a may be planarized through a chemical mechanical polishing process to be coplanar.

Referring to FIG. 3A, another substrate 100 is provided. The substrate 100 may be a semiconductor substrate, such as a silicon-containing substrate. An insulating layer 101 and a stop structure 103 are formed on the substrate 100. The insulating layer 101 may include silicon oxide. The stop structure 103 is formed on the insulating layer 101. The stop structure 103 may include multiple insulating layers 92 and multiple conductive layers 94 stacked alternately. The insulating layers 92 may include silicon oxide, and the conductive layers 94 may include polysilicon.

Referring to FIG. 3A, a lower part LP of a stacked structure SK1 (or called "first stacked structure" in some examples) is formed on the surface of the stop structure 103. The lower part LP of the stacked structure SK1 includes multiple insulating layers 102 and multiple intermediate layers 104 stacked alternately. In some embodiments, the material of the insulating layers 102 includes silicon oxide, and the material of the intermediate layers 104 includes silicon nitride. The intermediate layers 104 may serve as sacrificial layers, which will be partially removed in the subsequent processes.

Referring to FIG. 3A, multiple dummy pillars DVC are formed through the lower part LP of the stacked structure SK1. The method of forming the multiple dummy pillars DVCs includes forming single-stage lithography and etching processes or multi-stage lithography and etching processes to form multiple openings (not shown). The openings extend through the lower part LP of the stacked structure SK1 and extend to the stop structure 103, and even extend to the insulating layer 101. Then, a filling material (or a self-aligning material) is filled in the openings. The sidewall profiles of the openings formed by multi-stage lithography and etching processes may be bamboo-shaped.

Figure 3B:
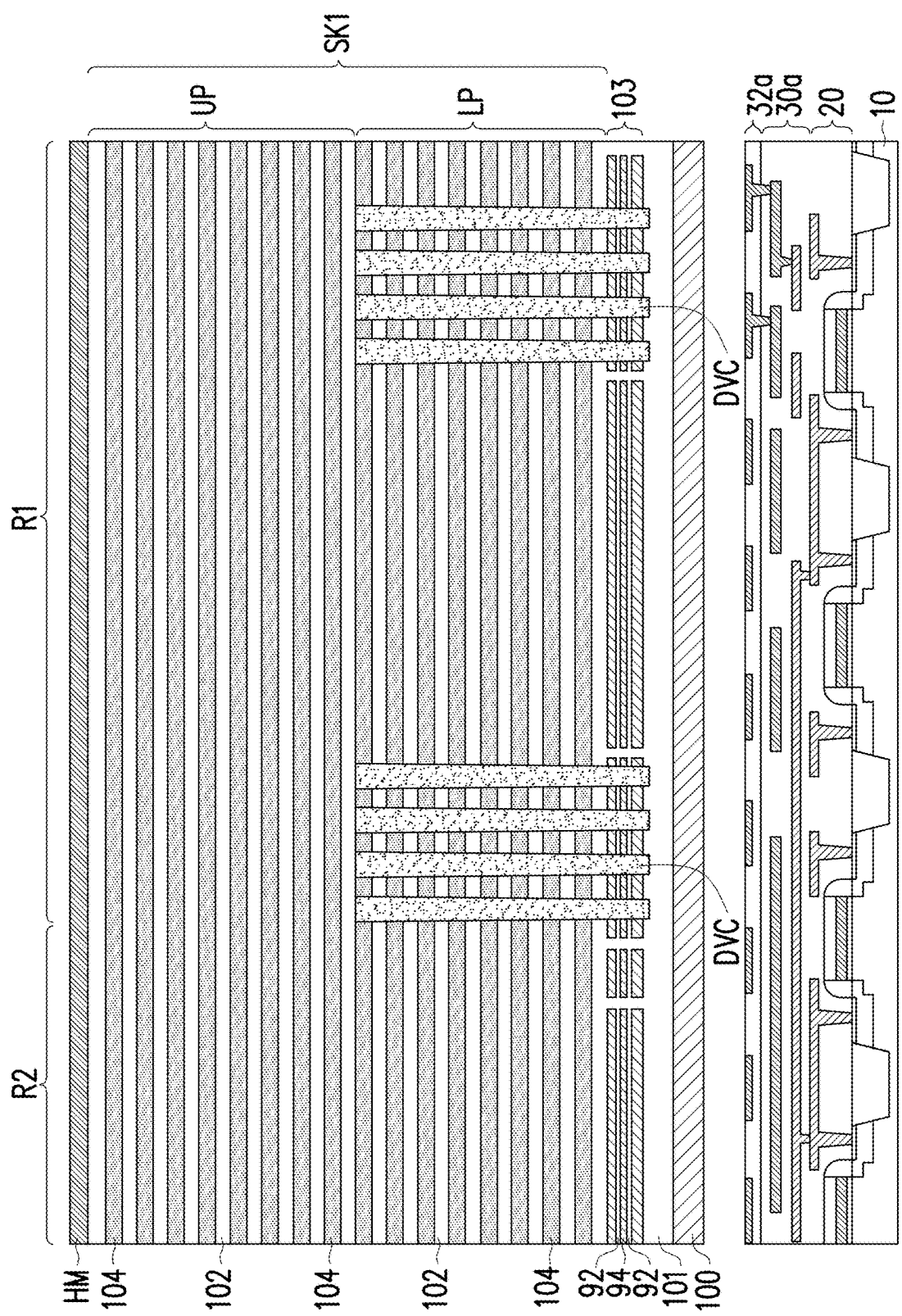

Referring to FIG. 3B, an upper part UP of the stacked structure SK1 is formed over the substrate 100. The upper part UP of the stacked structure SK1 includes multiple insulating layers 102 and multiple intermediate layers 104 stacked on each other. The materials of the insulating layer 102 and the intermediate layers 104 of the upper part UP of the stacked structure SK1 are the same as those described above for the materials of the insulating layer 102 and the intermediate layers 104 of the lower part LP of the stacked structure SK1. Thereafter, a hard mask layer HM is formed on the upper part UP of the stacked structure SK1. The hard mask layer HM includes polysilicon.

Figure 3C:
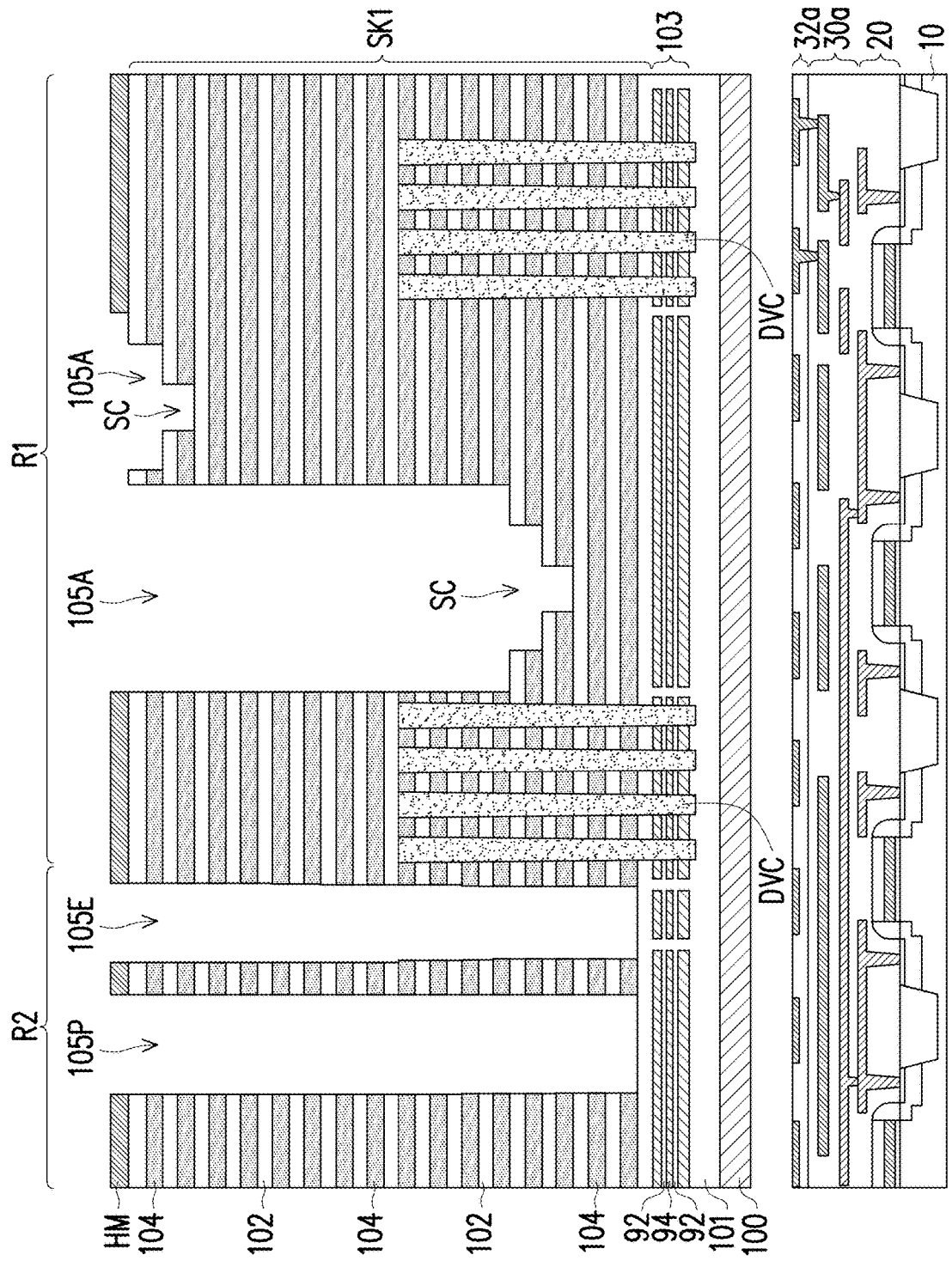

Referring to FIG. 3C, the hard mask layer HM is patterned. Thereafter, the intermediate layers 104 and insulating layer 102 of the stacked structure SK1 are patterned by using the hard mask layer HM as a mask, so as to form an opening 105A and a staircase structure SC in the memory plane region R1, form an opening 105P in the periphery region R2, and form an opening 105E at an end of the memory plane region R1. In some embodiments, the opening 105A and the staircase structure SC may be formed through a multi-stage patterning process, but the disclosure is not limited thereto. The patterning process may include processes such as lithography, etching and trimming. The opening 105P and the opening 105E are separated from each other by a part of the stacked structure SK1. The patterning process includes photolithography, etching, and trimming processes.

Figure 3D:
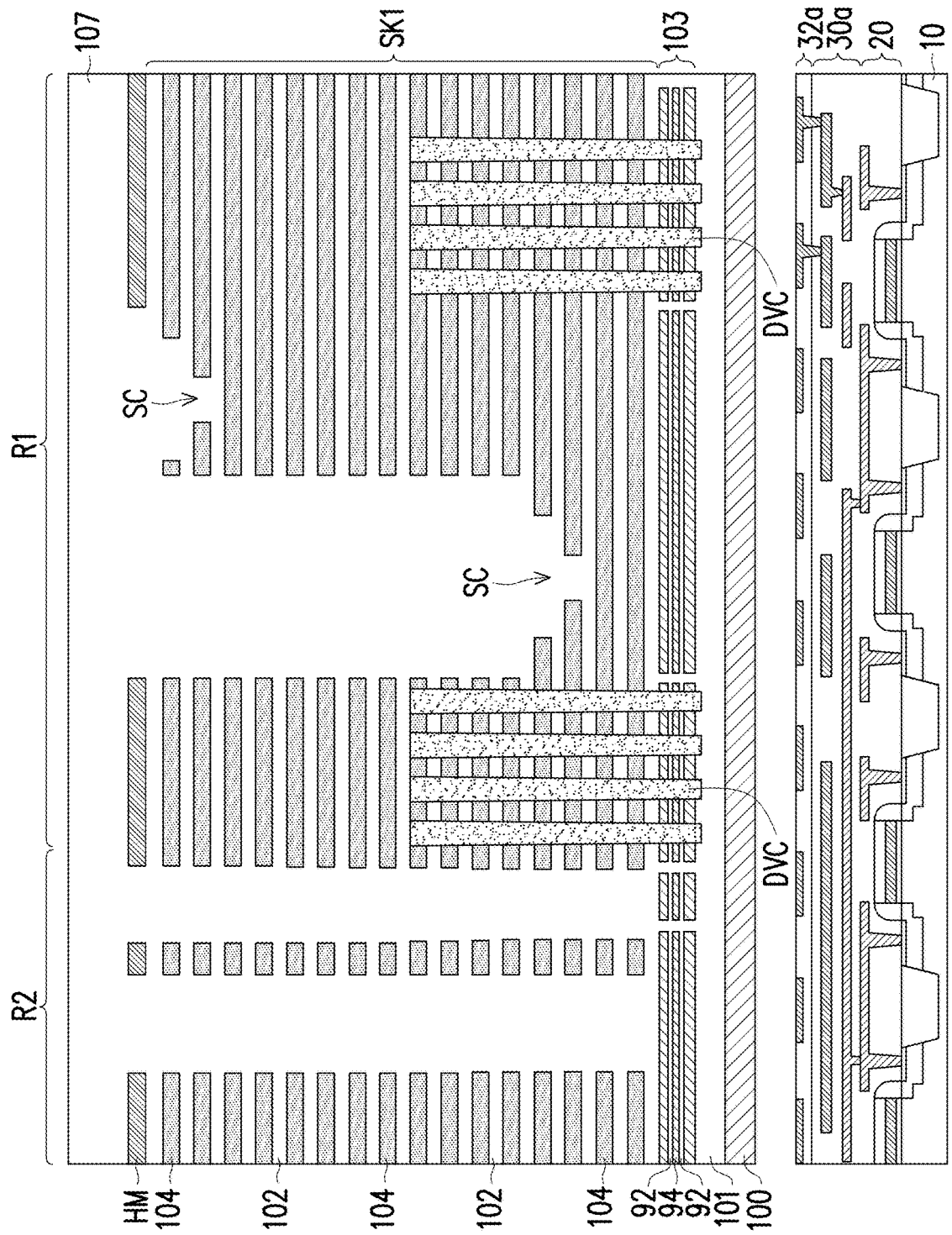
Figure 3E:
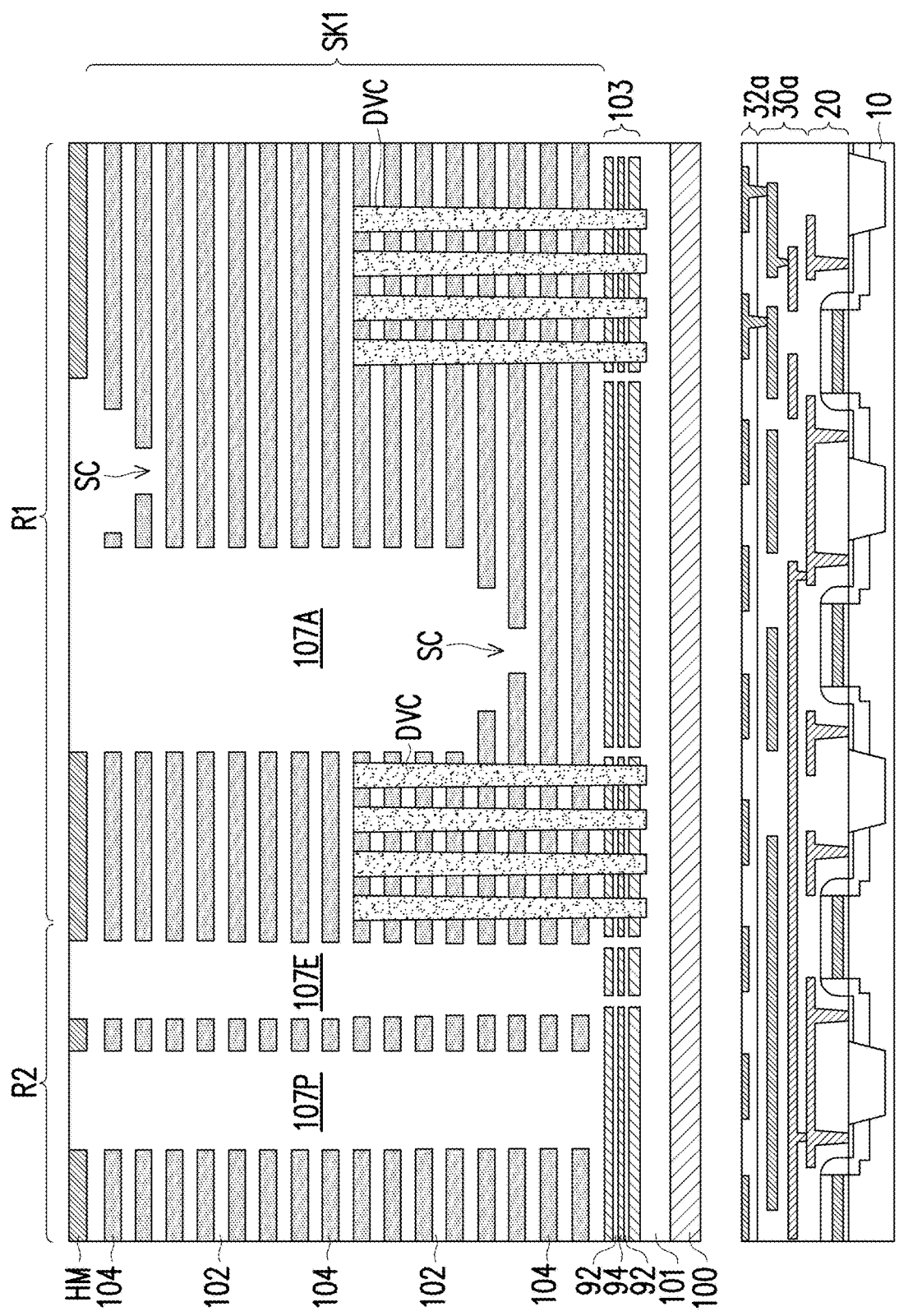

Referring to FIG. 3D and FIG. 3E, an insulating material 107 is formed on the stacked structure SK1 and completely filled in the openings 105A, 105P and 105E. The insulating material 107 may include silicon oxide, for example. Thereafter, a planarization process (such as a chemical mechanical polishing process) is performed by using the hard mask layer HM as a polishing stop layer, so as to remove the excess insulating material 107, and therefore form insulating structures 107A, 107P and 107E in the openings 105A, 105P and 105E, respectively.

Figure 3F:
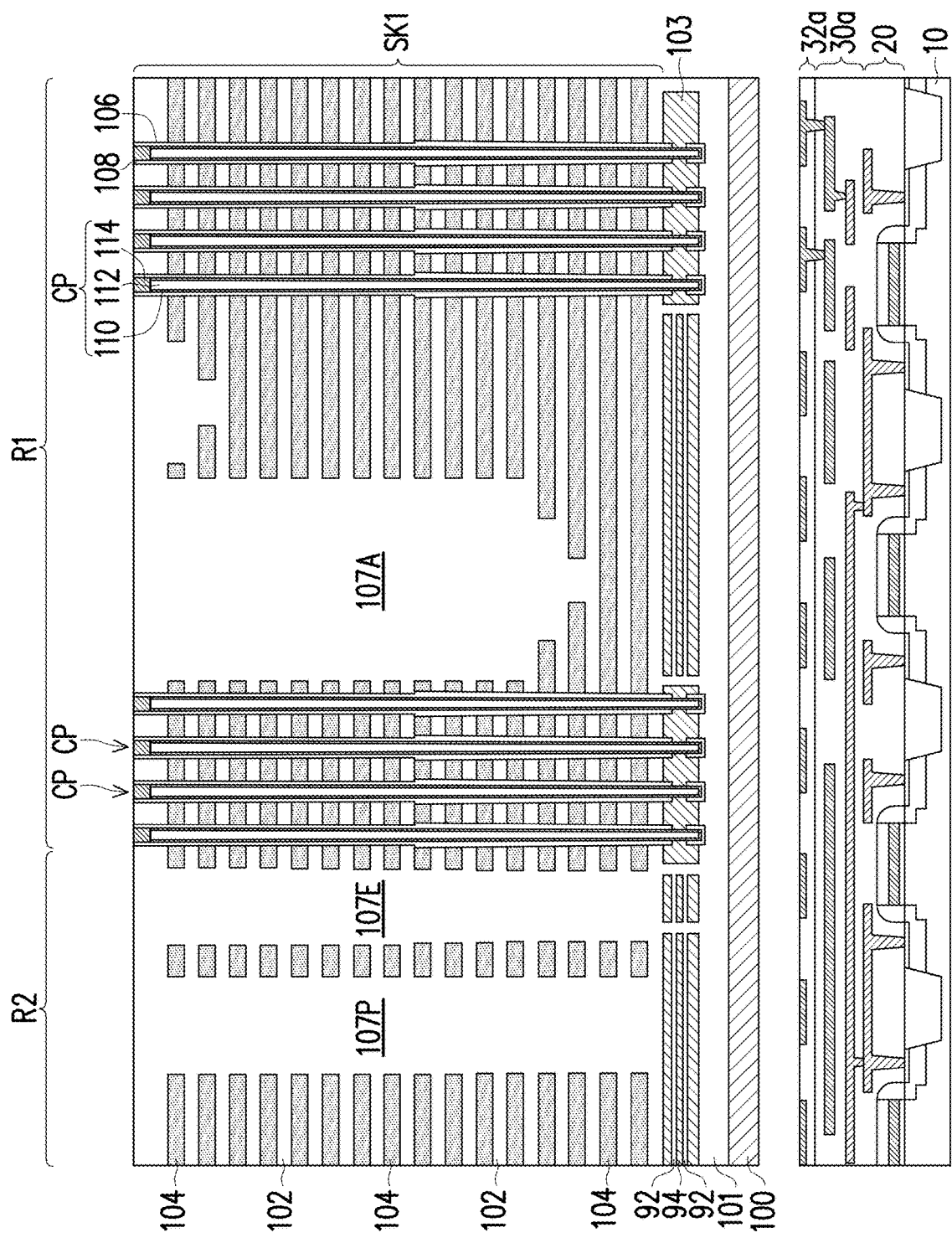

Referring to FIG. 3F, the hard mask layer HM is removed. Thereafter, a patterning process is performed to remove portions of the stacked structure SK1 to form openings (not shown), and the openings expose the dummy pillars DVC. Next, the dummy pillars DVC exposed by the openings are removed to form openings 106 extending through the stacked structure SK1. In one embodiment, the openings 106 may have slightly sloped sidewalls. In another embodiment, the openings 106 may have substantially vertical sidewalls (not shown). In one embodiment, the openings 106 are also called "vertical channel (VC) holes". In one embodiment, the openings 106 may be formed by single-stage lithography and etching processes. In another embodiment, the openings 106 may be formed by multi-stage lithography and etching processes. The sidewall profiles of the openings 106 formed by multi-stage lithography and etching processes may be bamboo-shaped.

Referring to FIG. 3F, charge storage structures 108 are then formed in the openings 106. The charge storage structures 108 are in contact with the insulating layers 102 and the intermediate layers 104. In one embodiment, each of the charge storage structures 108 is an oxide/nitride/oxide (ONO) composite layer. The charge storage structure 108 may be a conformal layer formed on the sidewall and the bottom of each of the openings 106. Afterwards, a vertical channel pillar CP is formed in the remaining space of each of the openings 106. Each vertical channel pillar CP may be formed by the following method.

Still referring to FIG. 3F, a channel layer 110 is formed on the inner sidewall and the bottom surface of the charge storage structure 108. In one embodiment, the material of the channel layer 110 includes undoped polysilicon. Next, an insulating pillar (or called "core insulating pillar" in some examples) 112 is formed on the inner surface of the channel layer 110. In one embodiment, the insulating pillar 112 may include silicon oxide. Afterwards, a channel plug 114 is formed in the opening 106, and the channel plug 114 is in contact with the channel layer 110. The channel plug 114 extends from a top surface of the topmost insulating layers 102 to a certain depth of the opening 106. In one embodiment, the material of the channel plug 114 includes a doped semiconductor material, such as doped polysilicon. The channel layer 110, the insulating pillar 112 and the channel plug 114 may be collectively referred to as a vertical channel pillar CP. The vertical channel pillar CP penetrates through the stacked structure SK1 and extends to the stop structure 103, and even extends to the insulating layer 101. The charge storage structure 108 surrounds the vertical outer surface of the vertical channel pillar CP.

Figure 3G:
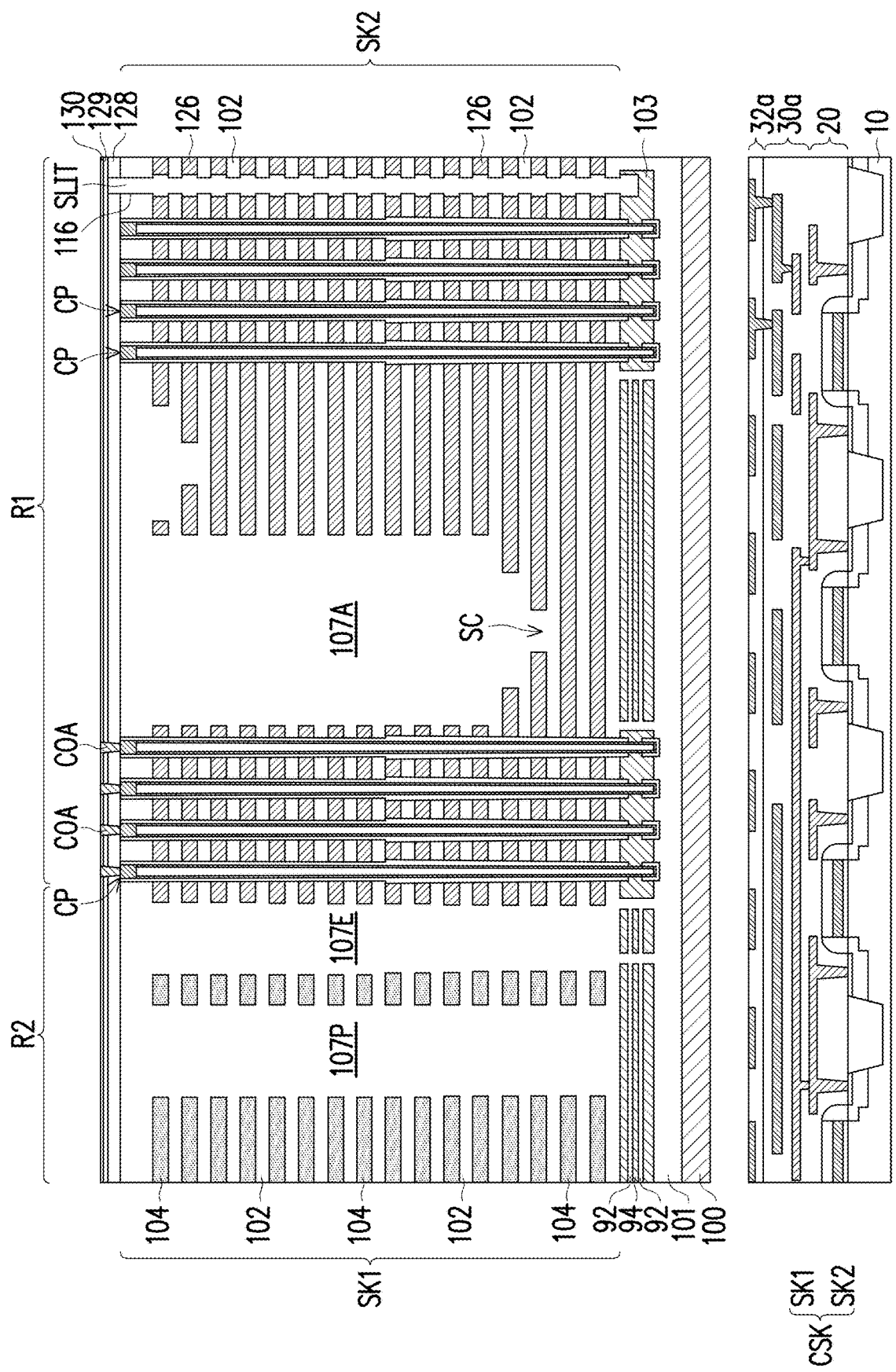

Referring to FIG. 3G, a dielectric layer 128 is formed on the stacked structure SK1. The dielectric layer 128 may include silicon oxide. Thereafter, a patterning process is performed to form one or more separation trenches 116. The separation trench 116 extends through the dielectric layer 128 and the stacked structure SK1 to divide the stacked structure SK1 into multiple blocks (not shown). The separation trench 116 may have wavy sidewalls, vertical sidewalls (not shown) or slightly inclined sidewalls (not shown).

Still referring to FIG. 3G, a replacement process is performed, so as to replace portions of the intermediate layers 104 with conductive layers 126. First, a selective etching process is performed, so that the etchant passes through the separation trench 116 and therefore contacts and removes the intermediate layers 104 of the stacked structure SK1 at both sides of the separation trench 116. Thereby, portions of the intermediate layers 104 are removed to form multiple horizontal openings (not shown), while the intermediate layers 104 in the periphery region R2 remain. The selective etching process may be an isotropic etching process, such as a wet etching process. The etchant used in the wet etching process may include hot phosphoric acid. Then, conductive layers 126 are formed in the horizontal openings. The conductive layers 126 may serve as gate layers. Each of the conductive layers 126 includes, for example, a barrier layer and a metal layer. In one embodiment, the material of the barrier layer includes titanium (Ti), titanium nitride (TiN), tantalum (Ta), tantalum nitride (TaN) or a combination thereof. The material of the metal layer includes tungsten (W). The portions of the intermediate layers 104 are replaced by the conductive layers 126, thus forming a stacked structure SK2 (or called "second stacked structure" in some examples).

The stacked structure SK2 and the stacked structure SK1 collectively form a composite stacked structure CSK. The stacked structure SK1 includes multiple insulating layers 102 and multiple intermediate layers 104 stacked alternately. The stacked structure S2 includes multiple insulating layers 102 and multiple conductive layers 126 stacked alternately. The vertical channel pillars CP extend through the stacked structure SK2.

Referring to FIG. 3G, a separation wall (or called "slit" in some examples) SLIT is formed in the separation trench 116. The separation wall SLTT may include a dielectric material and a conductive material. The dielectric material includes silicon nitride or a silicon oxide/silicon nitride/silicon oxide composite material. The conductive material includes doped polysilicon. The conductive material of the separation wall SLIT is insulated from the conductive layers 126 by the dielectric material. Thereafter, a stop layer 129 is formed on the dielectric layer 128 to cover the top surface of the separation wall SLIT. The stop layer 129 may include silicon nitride. A dielectric layer 130 is formed on the stop layer 129. The dielectric layer 130 may include silicon oxide.

Figure 3H:
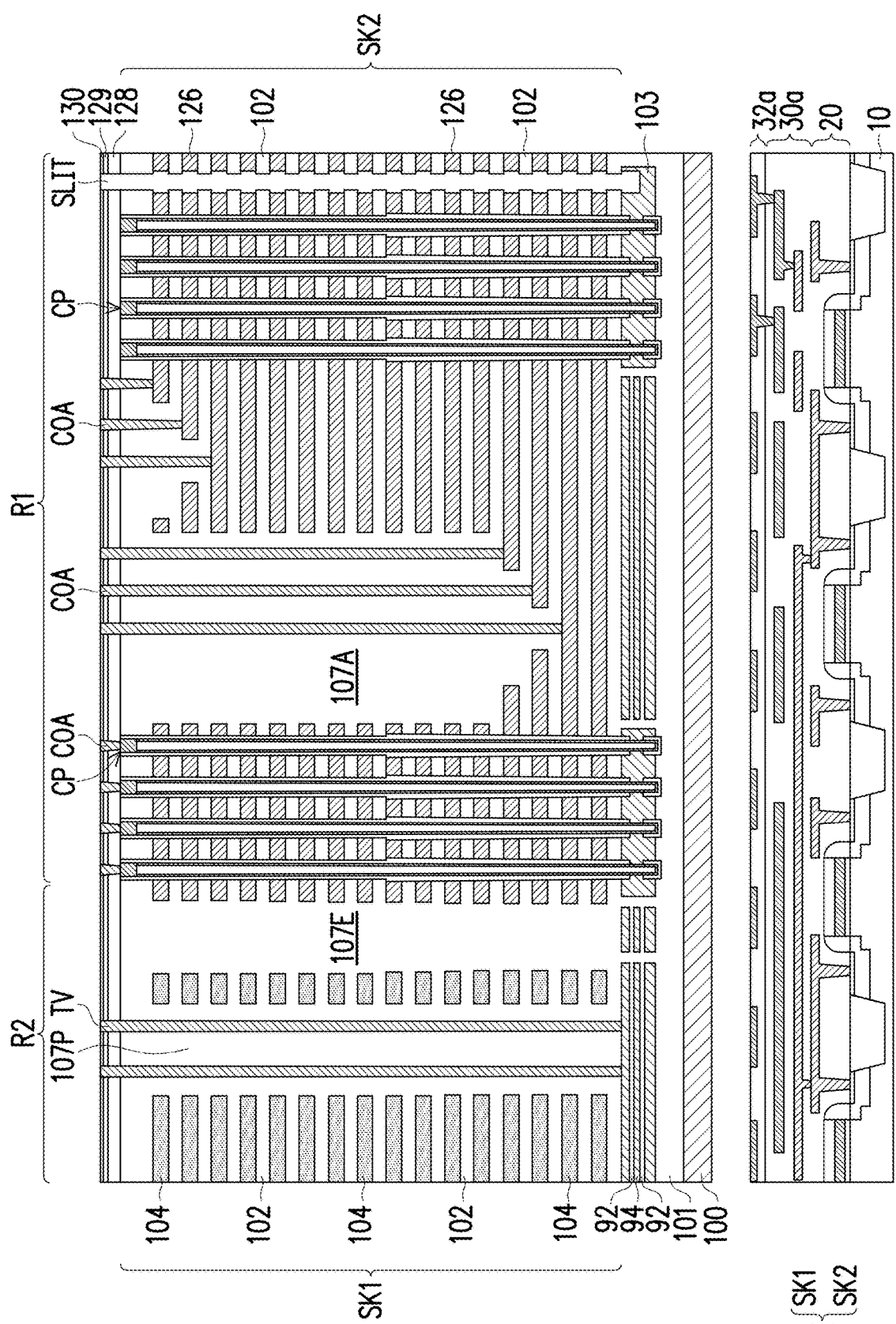
Figure 31:
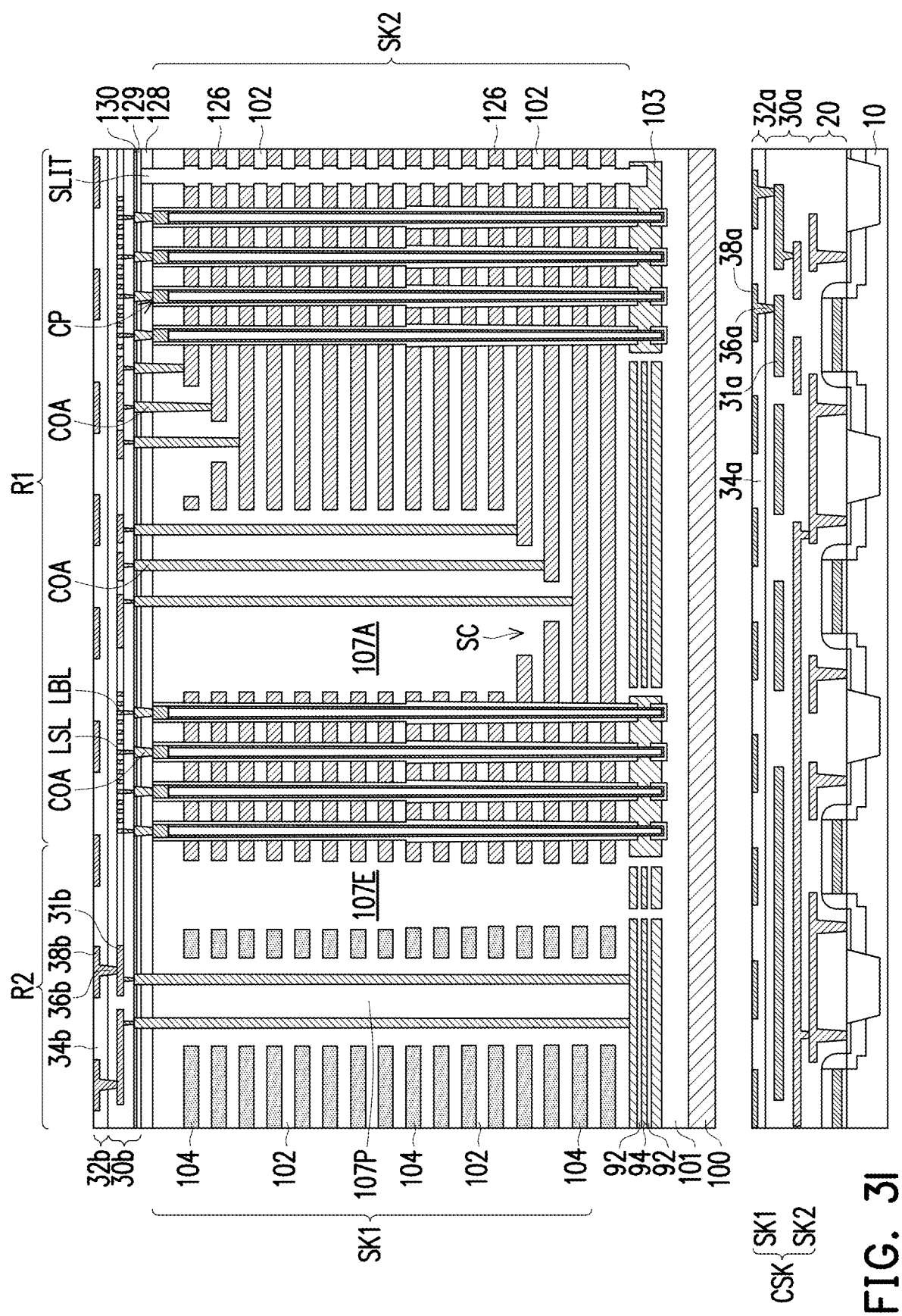
Figure 3J:
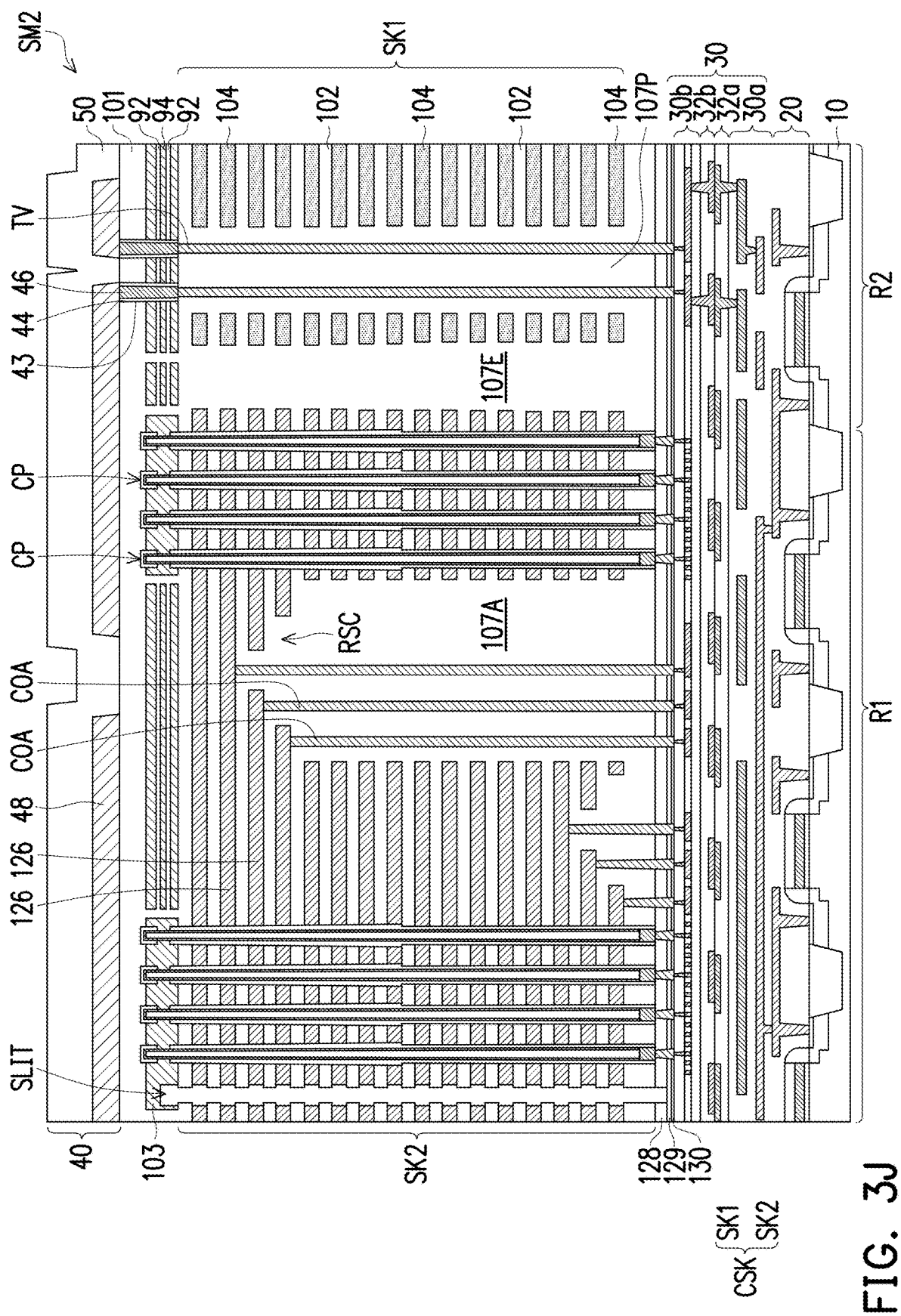

Referring to FIG. 3G and FIG. 3H, multiple contacts COA are formed through the dielectric layer 130 to the insulating structure 107A to electrically connect the conductive layers 126 and the vertical channel pillars CP respectively. Besides, multiple through vias TV are formed through the dielectric layer 130 to the insulating structure 107A. The method of forming the contacts COA and the through vias TV may include forming contact holes and through holes, and then forming a conductive material on the dielectric layer 130, filling in the contact holes and the through holes. Afterwards, an etching back or a chemical-mechanical polishing process is performed to remove the conductive material on the dielectric layer 130.

Referring to FIG. 3I, a second portion 30b of the interconnect structure 30 is formed over the substrate 100. The second portion 30b of the interconnect structure 30 may include multiple dielectric layers (not shown) and interconnect layers (not shown) formed in the multiple dielectric layers. The interconnect layers include multiple plugs (not shown), multiple conductive lines (not shown) or the like. A dielectric layer separates adjacent conductive lines from each other. The conductive lines may be connected by plugs, and the conductive lines may be connected to the contacts COA by plugs. The second portion 30b of the interconnect structure 30 may be formed by a single damascene process, a dual damascene process, or any known method. The second portion 30b of the interconnect structure 30 may include a local bit line LBL and a local source line LSL. The local bit line LBL and the local source line LSL are electrically connected to the vertical channel pillars CP by the contacts COA.

Referring to FIG. 3I, a second portion 32b of the bonding structure 32 (shown in FIG. 3J) is formed on the second portion 30b of the interconnect structure 30. The second portion 32b of the bonding structure 32 includes a bonding layer 34b, a bonding plug 36b and a bonding pad 38b. The bonding pad 38b is connected to the topmost conductive line 31b of the second portion 30b of the interconnect structure 30 through the bonding plug 36b. The materials and forming methods of the bonding layer 34b, the bonding plug 36b, and the bonding pad 38b may be the same or similar to those of the bonding layer 34a, the bonding plug 36a, and the bonding pad 38a.

Referring to FIG. 3J, the substrate 100 is turned over or flipped over. The staircase structure SC on the flipped substrate 100 becomes a reverse staircase structure RSC. The contacts COA are under the reverse staircase structure RSC. Next, referring to FIG. 3I and FIG. 3J, the second portion 32b of the bonding structure 32 is bonded to the first portion 32a of the bonding structure 32 to form a bonding structure 32. In the bonding structure 32, the bonding layer 34b is bonded to the bonding layer 34a, and the bonding pad 38b is bonded to the bonding pad 38a. The bonding layer 34b and the bonding layer 34a may be bonded by a dielectric-to-dielectric bonding. The bonding pad 38b and the bonding pad 38a may be bonded by a metal-to-metal bonding. The bonding structure 32 is located in the interconnect structure 30, and between the first portion 30a and the second portion 30b of the interconnect structure 30. The bonding structure 32, the first portion 30a and the second portion 30b constitute an interconnect structure 30. The device layer 20 may include a CMOS device, and is bonded to a memory array (e.g., located under the stacked structure SK2 in FIG. 3J) through a bonding method, and thus, this architecture can also be referred to as a complementary metal-oxide-semiconductor bonded the memory array (CMOS-Bonded-Array, CbA) structure.

Referring to FIG. 3J, the substrate 100 is removed to expose the insulating layer 101. The substrate 100 may be removed by grinding, polishing or etching.

Referring to FIG. 3J, liners 44, contacts 46, the conductive wires 48 and a dielectric layer 50 of the interconnect structure 40 are formed on the insulating layer 101. The contacts 46 are electrically connected to the through vias TV and the conductive wires 48. The contacts 46 are electrically insulated from the conductive layers 94 of the stop structure 103 by the liners 44. The method of forming the interconnect structure 40 may include the following steps. First, lithography and etching processes are performed to form contact openings 43 in the insulating layer 101 and the stop structure 103. Next, a liner 44 and a contact 46 are formed in each of the contact openings 43. The method of forming the liners 44 may include forming a dielectric material on the insulating layer 101 and in the contact openings 43, and then performing an anisotropic etching. The method of forming the contacts 46 may include forming a conductive material on the insulating layer 101 and in the contact openings 43, and then performing a chemical mechanical polishing process or an etching back process. The dielectric material may include a silicon nitride layer or a silicon oxide/silicon nitride/silicon oxide composite layer. The conductive material may include doped polysilicon. Afterwards, the conductive wires 48 and the dielectric layer 50 are formed on the insulating layer 101. The material of the conductive wires 48 includes copper or tungsten, for example. The dielectric layer 50 may be a single layer or include multiple layers. The material of the dielectric layer 50 may include silicon oxide, silicon oxynitride, silicon nitride or a combination thereof. The interconnect structure 40 can be electrically connected to the interconnect structure 30 by the through vias TV. The interconnect structure 30 is electrically connected to not only the through vias, but also the vertical channel pillars CP or the conductive layers 126 by the contacts COA. The fabrication of the memory device SM2 is thus completed.

Referring to FIG. 3J, the above-mentioned memory device SM2 is a CMOS-Bonded-Array (CbA) structure. However, the embodiments of the present disclosure are not limited thereto.

Figure 6:
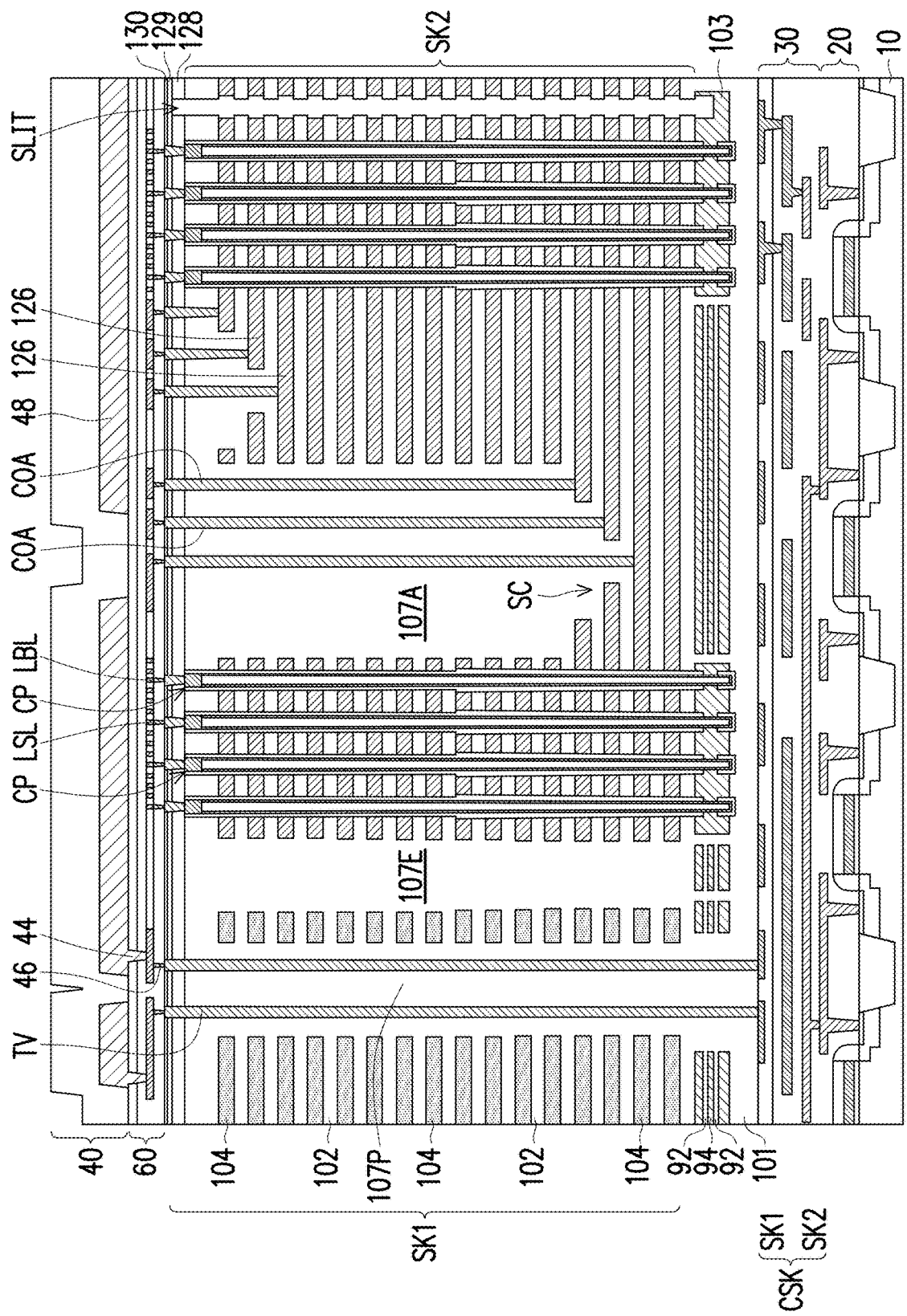
FIG. 6 is schematic cross-sectional views of a memory device according to an embodiment of the present disclosure.

Referring to FIG. 6, in some other embodiments, the embodiment of the present disclosure can also be used in a structure in which the device layer 20 is formed under the memory array, and this structure can also be referred to as a complementary metal oxide semiconductor under the memory array (CMOS-Under-Array, CUA) structure.

Referring to FIG. 6, a stacked structure SK1 is formed over the interconnect structure 30 on a substrate 10. A device layer 20 has been formed between the interconnect structure 30 under the stacked structure SK1 and the substrate 10. A staircase structure SC, insulating structures 107A, 107E, 107P, vertical channel pillars CP, a stacked structure SK2, contacts COA and through vias TV are formed by methods similar to those described in the above embodiments.

Next, a dielectric layer 60, contacts 46 (electrically connected to the through vias TV), a bit line (not shown) and a source line (not shown) and an interconnect structure 40 are formed.

In summary, the stacked structure of an embodiment of the present disclosure remains in a periphery region. Multiple through vias in the periphery region are insulated from each other by multiple insulating structures. The insulating structures are separated from each other. The insulating structures are formed by removing a small portion of the stacked structure in the periphery region and backfilling a small amount of an insulating material. Therefore, the deposition amount of the insulating material can be reduced, and the time for polishing the excess insulating material can be reduced.

What is claimed is:

1. A memory device, comprising:
    a substrate, comprising a memory plane region and a periphery region; and
    a composite stacked structure, located on the substrate in the memory plane region and the periphery region, wherein the composite stacked structure comprises:
    a first stacked structure, comprising a plurality of first insulating layers and a plurality of intermediate layers alternately stacked on each other, and located on the substrate in the periphery region;
    a plurality of first insulating structures, separated from each other, extending through the first stacked structure in the periphery region, and respectively surrounded by the plurality of first insulating layers and the plurality of intermediate layers; and
    a plurality of through vias, extending through one of the plurality of first insulating structures,
    wherein a ratio of a width to a height of each of the plurality of first insulating structures is less than 2.

2. The memory device according to claim 1, wherein the plurality of first insulating structures are separated from each other by corresponding portions of the plurality of first insulating layers and the plurality of intermediate layers of the first stacked structure.

3. The memory device according to claim 1, wherein shapes of the plurality of first insulating structures comprise a rectangle shape, and outer sidewalls of each of the plurality of first insulating structures are in contact with corresponding parts of the plurality of first insulating layers and the plurality of intermediate layers.

4. The memory device according to claim 1, wherein a ratio of a sum of diameters of the plurality of through vias along a first direction to a width of the one first insulating structure along the first direction is from 0.006 to 0.15.

5. The memory device according to claim 1, wherein shapes of the plurality of first insulating structures comprise a ring shape, and inner sidewalls and outer sidewalls of each of the plurality of first insulating structures are respectively in contact with corresponding parts of the plurality of first insulating layers and the plurality of intermediate layers.

6. The memory device according to claim 1, wherein the plurality of first insulating structures are separated from each other by corresponding portions of the first stacked structure.

7. The memory device according to claim 1, wherein the composite stacked structure further comprises:
    a second stacked structure, comprising the plurality of first insulating layers and a plurality of conductive layers stacked alternately, and located on the substrate in the memory plane region.

8. The memory device according to claim 7, wherein the second stacked structure is surrounded by the first stacked structure.

9. The memory device according to claim 7, further comprising:
    a plurality of second insulating structures, separated from each other, extending through the second stacked structure in a staircase region of the memory plane region, and respectively surrounded by the plurality of first insulating layers and the plurality of conductive layers; and
    a plurality of contacts, some of which are extending through one of the plurality of second insulating structures and each contact is electrically connected to a corresponding conductive layer from the plurality of conductive layers.

10. The memory device according to claim 7, further comprising:
    a plurality of third insulating structures, located at ends of a plurality of array regions of the memory plane region and configured to separate the first stacked structure from the second stacked structure.

11. The memory device according to claim 10, further comprising:
    a fourth insulating structure, surrounding a boundary of the first stacked structure (SK1), and
    a seal ring, extending through the fourth insulating structure.

12. The memory device according to claim 11, wherein the fourth insulating structure is separated from the plurality of third insulating structures by the first stacked structure.

13. The memory device according to claim 11, wherein the fourth insulating structure is separated from the plurality of first insulating structures by the first stacked structure.

* * * * *